United States Patent
Singarajan et al.

(10) Patent No.: US 7,103,519 B2
(45) Date of Patent: Sep. 5, 2006

(54) VIRTUAL MANUFACTURING SYSTEM

(75) Inventors: Kumar Singarajan, Canton, MI (US); Michael A Dahl, Clarkston, MI (US); Gary L Aldrich, Wixom, MI (US); Robert A George, Novi, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 774 days.

(21) Appl. No.: 10/251,396

(22) Filed: Sep. 20, 2002

(65) Prior Publication Data

US 2003/0055619 A1 Mar. 20, 2003

Related U.S. Application Data

(60) Provisional application No. 60/323,898, filed on Sep. 20, 2001.

(51) Int. Cl.
G06F 9/455 (2006.01)
(52) U.S. Cl. .............................. 703/8; 705/26; 705/10; 701/49; 701/101
(58) Field of Classification Search .................... 703/8; 705/26, 10; 701/49, 101; 700/94; 707/104.1; 715/866; 710/315; 340/5.5, 825.22; 454/141; 477/3

See application file for complete search history.

(56) References Cited

U.S. PATENT DOCUMENTS

| | | | | |
|---|---|---|---|---|
| 5,999,104 | A * | 12/1999 | Symanow et al. | 340/825.22 |
| 6,151,547 | A * | 11/2000 | Kumar et al. | 701/101 |
| 6,186,886 | B1 * | 2/2001 | Farrington et al. | 454/141 |
| 6,300,948 | B1 * | 10/2001 | Geller et al. | 715/866 |
| 6,611,201 | B1 * | 8/2003 | Bishop et al. | 340/5.5 |
| 6,718,425 | B1 * | 4/2004 | Pajakowski et al. | 710/315 |
| 6,804,565 | B1 * | 10/2004 | Eid | 700/94 |
| 2001/0039230 | A1 * | 11/2001 | Severinsky et al. | 477/3 |
| 2002/0032510 | A1 * | 3/2002 | Turnbull et al. | 701/49 |
| 2002/0032611 | A1 * | 3/2002 | Khan | 705/26 |
| 2002/0065707 | A1 * | 5/2002 | Lancaster et al. | 705/10 |
| 2002/0091706 | A1 * | 7/2002 | Anderson et al. | 707/104.1 |
| 2002/0140289 | A1 * | 10/2002 | McConnell et al. | 307/10.1 |

OTHER PUBLICATIONS

Kassakian st al, "The future iof electronics in automobiles", IEEE, Jun. 2001.*
Glielmo et al., "A machine learning approach to modeling and identification of automotive three way catalytic converters", IEEE 2000.*
Karray et al., "Intelligent control esign for a class of automotive systems: case study", IEEE Jul. 1997.*

(Continued)

Primary Examiner—Kandasamy Thangavelu
(74) Attorney, Agent, or Firm—Ralph E. Smith

(57) ABSTRACT

A method and system for increasing standardization and reuse of feature driven design of automotive vehicles. An automotive vehicle is represented by a vehicle model, which includes a set of features defining vehicle functionality and information on how to implement each feature. A features database stores information on how a feature is implemented, including the physical parts it requires and the configuration of the parts. A parts database is also provided for maintaining information on vehicle parts. Coupled to the features database and the parts data base is a feature manager arranged to determine physical implementation information for each feature based on the implementation information. The physical implementation information is included in the vehicle model. A conflict manager is provided for resolving conflicts between implementations of separate features, and an optimizer for standardizing parts and implementations across multiple vehicle models.

16 Claims, 6 Drawing Sheets

OTHER PUBLICATIONS

Kendall et al., "Simulation as a means of achieving the impossible: an investigation into the use of simulation in the development of electronic control systems at Jaguar cars", IEEE 1998.*

Van Vliet et al., "State of the art report on design for manufacturing", 1999 ASME Design Engineering Technical conferences.*

Shih et al., "A Design/constraint model to capture design intent", ACM 1997.*

Yang et al., "Research on Parametric feature modeling based on knowledge", IEEE 2002.*

Thanapandi et al., "Algorithms for orthographic views with hidden entities and manufacturing features information for sheet metal parts", Google, 1999.*

Smith et al., "Identifying controlling features of engineering design iteration", Management Science, Mar. 1997.*

Shyamsundar et al., "Internet based collaborative product design with assembly features and virtual design spaces", Elsevier Science Ltd, 2001.*

Keutzer et al., "system level design: orthogonalization of concerns and platform based design", IEEE 2000.*

Regli et al., "A survey of design rationale systems: Approaches, representation, capture and retrieval", Spring-Verlag, 2000.*

* cited by examiner

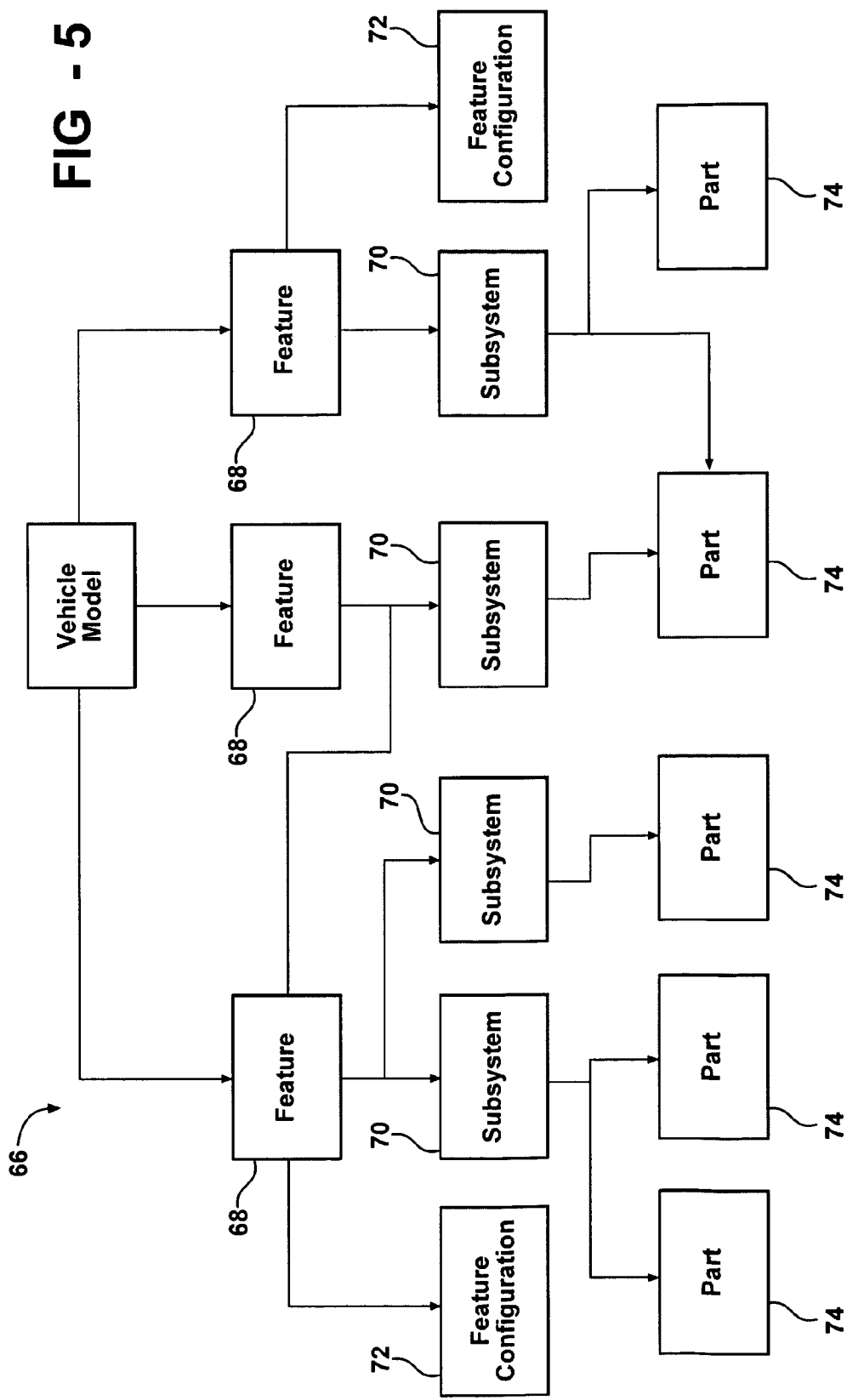

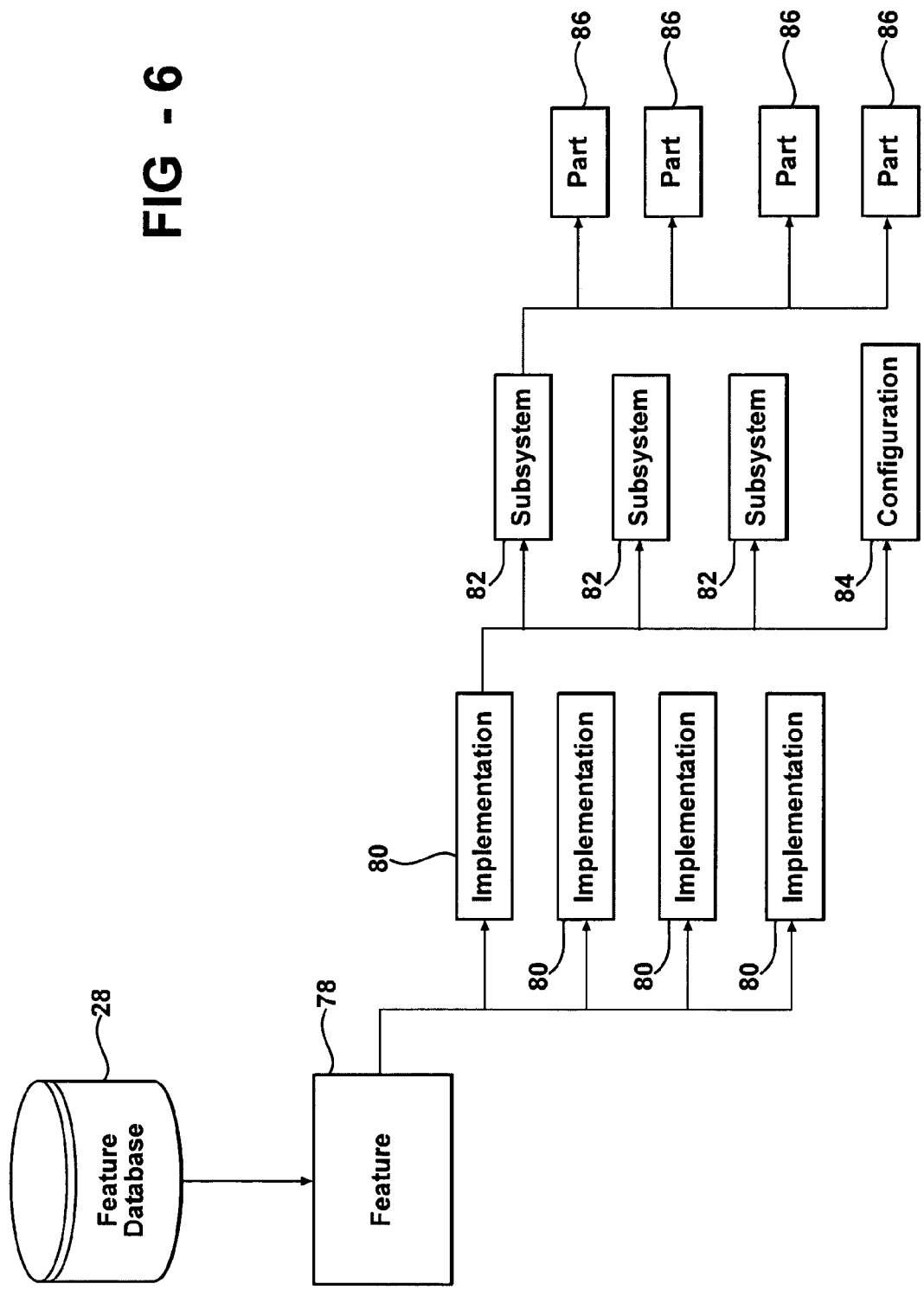

VIRTUAL MANUFACTURING SYSTEM

This application claims the benefit of U.S. Provisional Application No. 60/323,898, filed Sep. 20, 2001.

BACKGROUND

1. Field of the Invention

The following invention relates to systems and methods for designing automotive vehicles.

2. Background Art

Traditionally, automotive vehicles have been designed as a composition of mechanical and electrical parts. A manufacturer may represent a vehicle in its records as a bill of materials, or parts list, along with computer drawings. The vehicle can then be manufactured to the specifications set out in the bill of materials and drawings.

A typical design cycle may include a manufacturer's marketing department indicating a set of requirements to the engineering department, who determine what parts to use and how to configure them to meet the requirements. This may be an iterative process, with engineering responsibility often being divided across vehicle subsystems. For instance, a separate group of engineers may be assigned to work on the vehicle's powertrain. Those engineers' responsibility could, in turn, be divided among vehicle engine and transmission.

Automobile manufacturers often design and manufacture multiple vehicles simultaneously. Because of volume discounts from suppliers, the cost of duplicative engineering efforts, and other efficiency concerns, it is advantageous for the manufacturer to standardize engineering knowledge, such as parts use and implementation, across different product offerings and thus leverage engineering efforts across different products. To achieve this, teams of engineers often work on more than one product offering, and are encouraged to drive this standardization.

However, the common parts-centric design scheme can prevent realizing the true potential of engineering standardization. It can be difficult to track the engineering knowledge behind the existing physical reuse, and thus may not be conducive to future reuse, especially as human talent migrates to different jobs. Thus it is desirable to have a system for and method of designing vehicles that better preserves engineering knowledge and promotes effective reuse and standardization.

SUMMARY OF THE INVENTION

In accordance with the present invention, a system and method are provided for increasing standardization of feature driven design of automotive vehicles. The vehicle is represented by a vehicle model. The system includes a database for storing vehicle features records. Each feature record includes information on how a feature, or piece of vehicle functionality, is implemented. The system further includes a parts database, which contains information on vehicle parts. A part is a physical vehicle component, and vehicle functionality is implemented by parts. Coupled to the features database and the parts data base is a feature manager. The feature manager determines physical implementation information for each feature based on the implementation information in the feature record and includes this physical implementation information in the vehicle model.

BRIEF DESCRIPTION OF THE DRAWINGS

The various advantages of the present invention will become apparent to one skilled in the art by reading the following specification and subjoined claims and by referencing the following drawings in which:

FIG. 5 is a vehicle model record in accordance with a preferred embodiment of the present invention; and FIG. 6 is a feature record in accordance with a preferred embodiment of the present invention.

DETAILED DESCRIPTION OF THE PREFERRED EMBODIMENT

Figure 1:
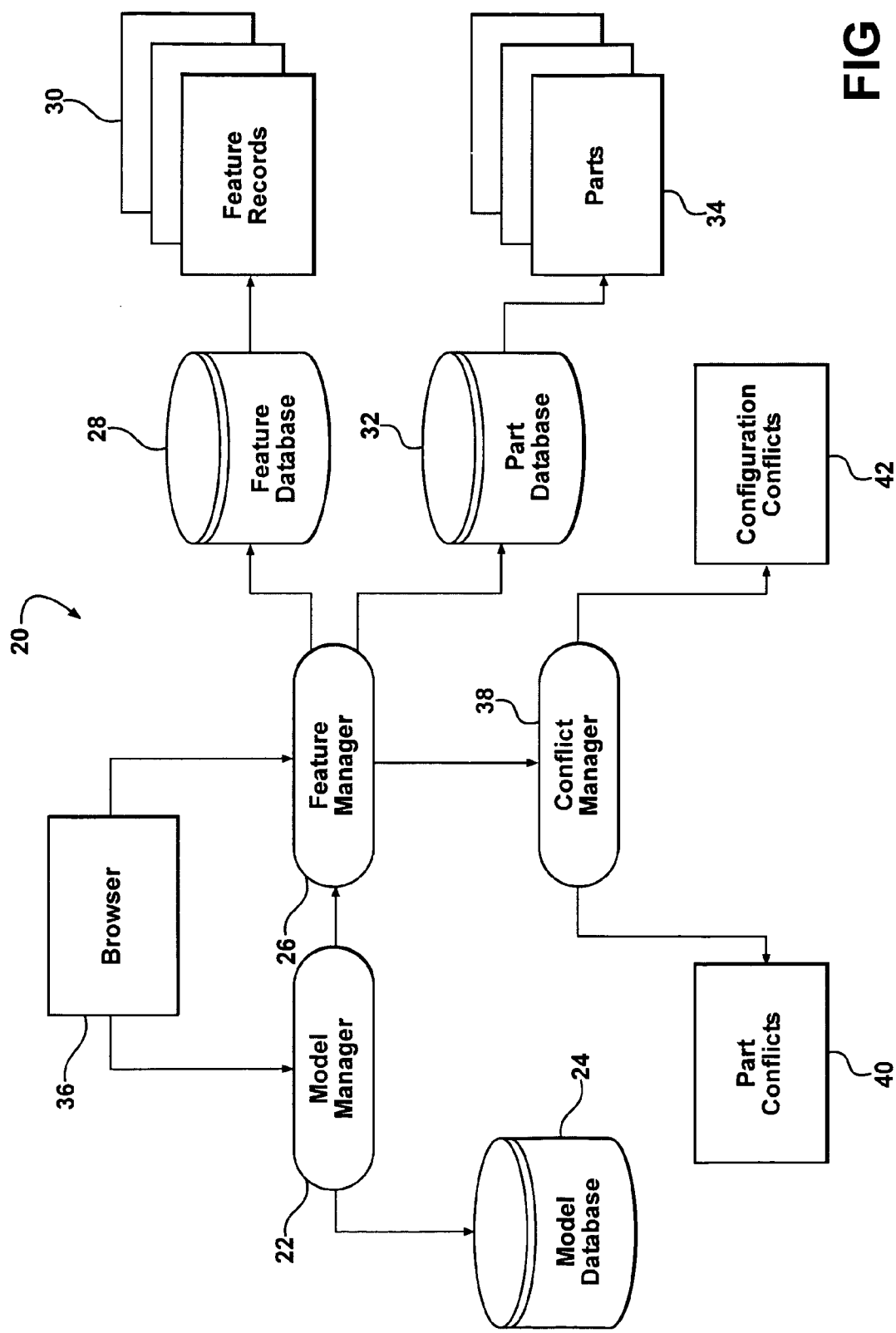
FIG. 1 is a block diagram of a vehicle model management system in accordance with a preferred embodiment of the present invention.

With reference to FIG. 1, there is shown a computer implemented system for the management of vehicle models 20. A vehicle model in accordance with a preferred embodiment of the present invention is a computer representation of an automotive vehicle including information on the structure and fabrication of the vehicle. The model management system 20 includes a model manager 22 for managing a plurality of related vehicle models connected to a model database 24 for storing the vehicle models.

In accordance with a preferred embodiment of the present invention, a vehicle model includes a plurality of vehicle features that define discrete portions of vehicle functionality. The model management system 20 includes a feature manager 26 connected to the model manager 22 for the management of the set of features included in the vehicle models. The feature manager 26 is connected to a features database 28 which includes a plurality of feature records 30 that represent vehicle features. The feature records 30 include information on the implementation of the functionality included in each feature, including the vehicle subsystems, physical parts and the part configurations necessary to implement each feature. The features represented in the feature records 30 may be common to a plurality of vehicle models. The feature manager is also connected to a parts database 32 which includes information on individual physical parts 34 used to implement vehicle features.

A user can interact with the model manager 22 and the feature manager 26 by using a network browser 36. In accordance with a preferred embodiment of the present invention, a user, such as a vehicle designer, designs a vehicle through interaction with the model manager 22 and feature manager 26. The designer, through the browser 36, specifies a set of desired features to be included in the vehicle. The feature manager 26 generates implementations of the features specified by the user. Generating feature implementations includes determining which of a plurality of subsystems are necessary to implement each feature and determining which parts are necessary to implement each subsystem. After the feature manager 26 generates the feature implementations, the model manager 22 creates a vehicle model incorporating the set of features.

It is possible that a desired feature conflicts with another desired feature. For example, the feature of four-wheel drive may not be compatible with other desired features in a designing a sports coupe. Accordingly, in a preferred embodiment of the present invention, the model management system 20 further includes a conflict manager 38. The conflict manager includes a parts conflict detector 40 which detects incompatibility between physical parts or subsystems. The conflict manager 38 further includes a configuration conflict detector 42, which detects incompatibility between parts and subsystems due to their configurations.

Because of the complexity involved in designing automotive vehicles, there are often multiple ways of implementing a single feature. Accordingly, in a preferred embodiment of the present invention, each feature record 30 can include a plurality of implementations for the feature it represents, with each implementation including part and configuration information. The feature manager 26 determines the most appropriate feature implementation based on the user input. Furthermore, the feature manager 26 and the conflict manager 38 interact such that if conflicts are found within one set of features, new implementations can be chosen by the feature manager 26 with conflict manager 38 input for some or all of the features. Thus, a set of features that does not create conflicts will be generated by the feature manager 26 if such a set is possible.

Figure 2:
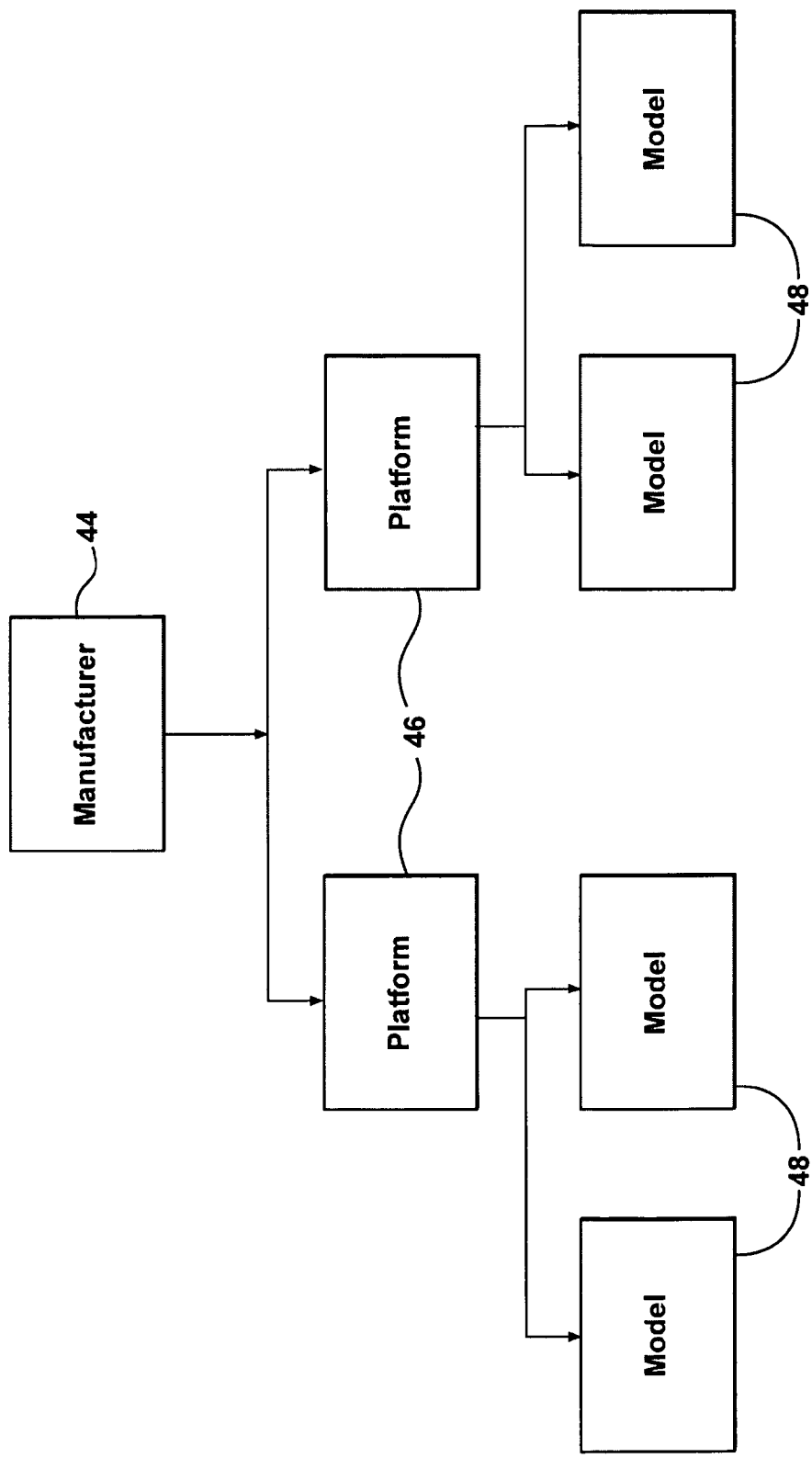
FIG. 2 is a vehicle organizational hierarchy for an automotive vehicle manufacturer.
Figure 3:
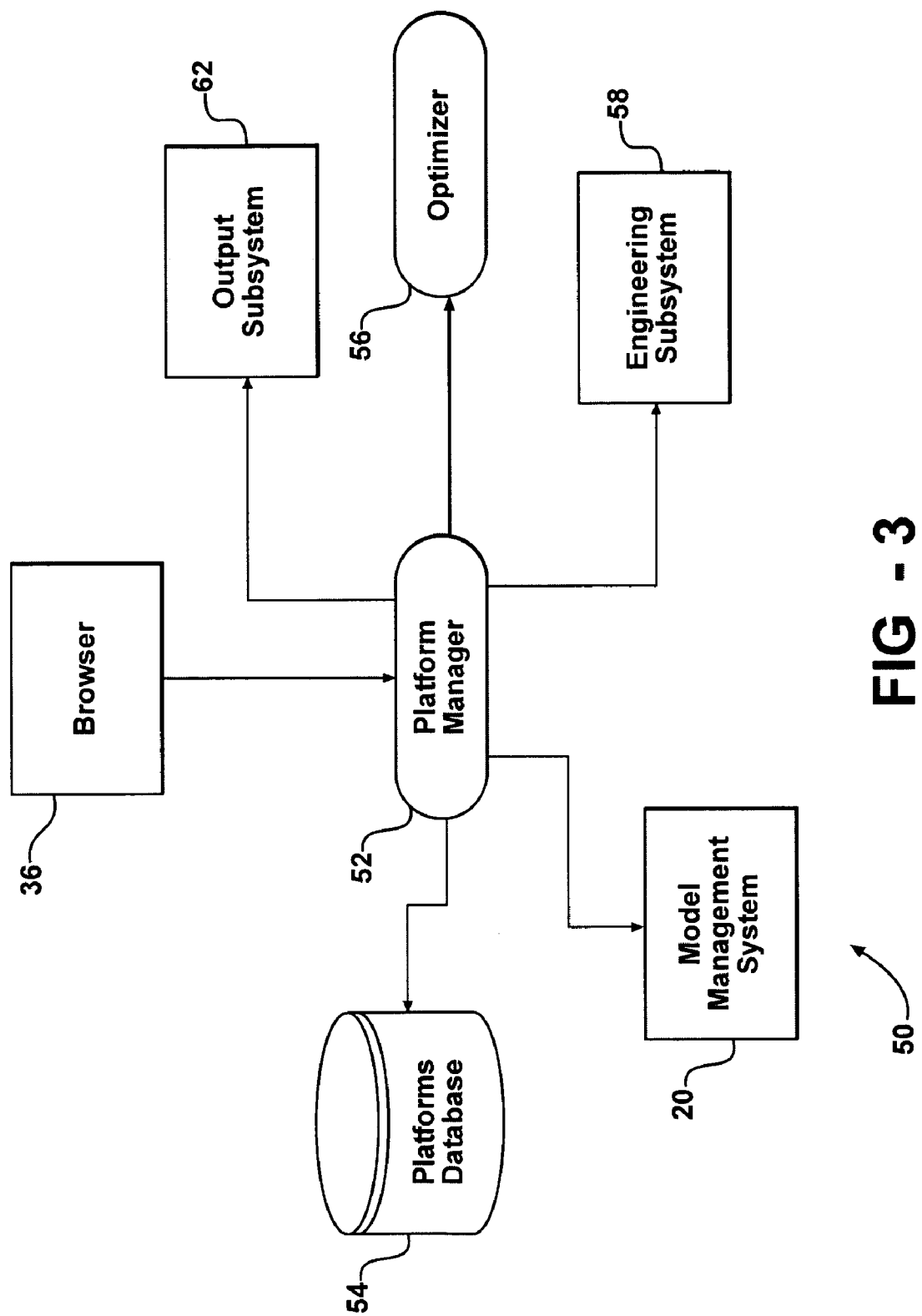
FIG. 3 is a block diagram of a vehicle platform management system in accordance with a preferred embodiment of the present invention.

With reference to FIG. 2, it is possible for a vehicle manufacturer to hierarchically organize its product offerings to leverage commonality and reusability. A typical structure for a manufacturer 44 includes multiple high-level platforms 46, with each platform including several vehicle offerings 48. Accordingly, in a preferred embodiment of the present invention, vehicle design is also managed at a platform level. With reference to FIG. 3, there is shown a platform management system 50 for managing a plurality of vehicle platforms and the vehicle offerings associated with them. Each vehicle offering is represented by a vehicle model.

The platform management system 50 includes a platform manager 52 connected to the model management system 20. The platform manager 52 manages the vehicle models and their associations as it relates to product organization at the platform level. This platform and associated vehicle information is stored in a platform database 54 connected to the platform manager 52. The platform manager 52 restricts design freedom by limiting feature and implementation selection within a platform. This increases commonality and reuse. The designer interacts with the platform management system using the network browser 36.

Thus in designing a vehicle, a designer first chooses a platform 46 in which the vehicle will be categorized. The platform manager 52 restricts the availability of features and implementations. The designer then chooses features from the restricted list. The feature manager 26 selects from the available implementations contained in the features database 28 and not restricted by the platform manager 52 and generates the most appropriate vehicle model based on the designer input and platform restrictions. The conflict manager 38 analyzes the vehicle model for parts and configuration conflicts. The feature manager 26 then selects new implementations from the features database 28 to avoid any detected conflicts.

According to a preferred embodiment of the present invention, commonality and reusability are increased through the use of an optimizer 56 connected to the platform manager 52. The optimizer 56 standardizes parts, subsystems, and configurations within and among platforms by suggesting or substituting alternate parts, subsystems, or configurations such that a plurality of vehicles include identical or similar implementations for a given feature. The optimizer 56 accesses vehicle models in the platforms database 54 to determine which parts and subsystems to standardize. In one mode of operation, the optimizer 56 is invoked after an initial vehicle model is created. The optimizer 56 performs initial optimization. After this first level of optimization, the feature manager 26, in conjunction with the conflict manager 38, detects and avoids any parts and configuration conflicts caused by the optimization. Successive iterations of optimization and conflict avoidance may be performed as necessary to generate a final vehicle model.

The optimization process described changes implementations, subsystems, parts, and configurations by the records available in the features database 28 and the parts database 32. In a preferred embodiment, engineering intervention supplements the optimization process. Possible engineering intervention includes adding, removing, or replacing parts in the parts database, 32. Also, engineering intervention could include redesigning existing feature implementations or adding new features or implementations and modifying the features database 28 accordingly.

In one mode of operation, a vehicle designer or engineer interacts with the platform manager 52 and optimizer 56 using the browser 36 during the optimization stage. In another mode of operation, the platform manager 52 interacts with an engineering subsystem 58, allowing an engineering department to define the timing and scope of the intervention.

Figure 4:
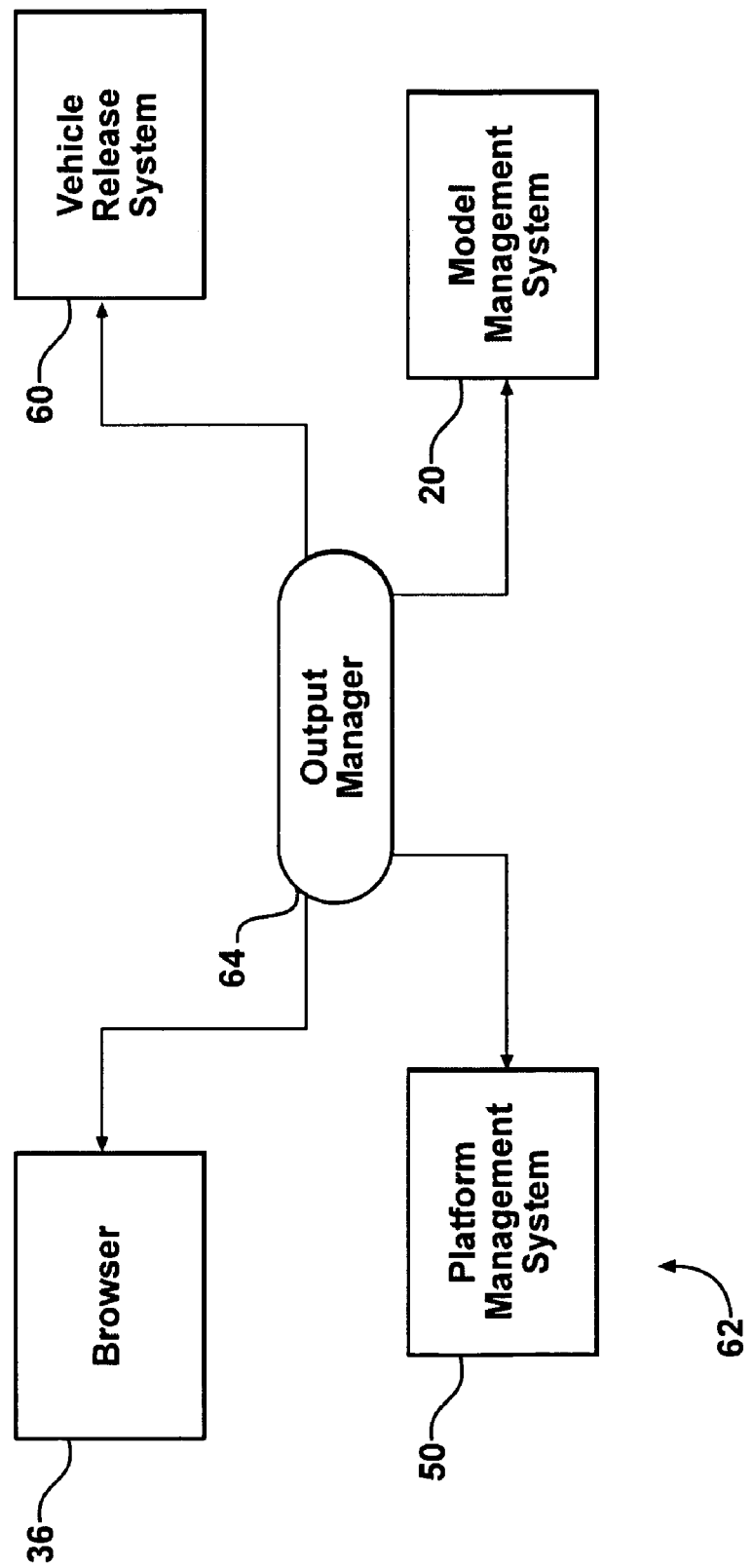
FIG. 4 is a block diagram of a vehicle model output subsystem in accordance with a preferred embodiment of the present invention.

Once a vehicle has been designed, it is necessary to bring the vehicle to market. Typically, with reference to FIG. 4, this takes place through a vehicle releasing system 60, which manages the manufacturing of the vehicle. A typical releasing system will process information concerning each part on a vehicle, part placement information, and other configuration information. In a preferred embodiment of the present invention, the model management system 20 and platform management system 50 interact with an existing vehicle releasing system 60 through an output subsystem 62. The output subsystem 62 includes an output manager 64 connected to the model management system 20, platform management system 50, and vehicle releasing system 60 for translating vehicle models into information useable by the vehicle releasing system 60. In one mode of operation, the output manager 64 translates the vehicle model from a features-centric design, composed of a set of features, to parts-centric information, such as a vehicle model representing a vehicle as a set of physical parts.

With reference to FIG. 5, in a preferred embodiment of the present invention, vehicle models are represented in the vehicle model database as vehicle model data records 66. A vehicle model data record 66 includes a plurality of feature data fields 68 representing discrete pieces of vehicle functionality. Each feature data field 68 includes a plurality of subsystem data fields 70, which include the subsystems necessary to implement the system. Each feature data field 68 also includes at least one configuration data field 72, including information on how the subsystems and parts are configured to implement the feature. Each subsystem data field 70 includes at least one part data field 74, which includes information on a physical part that will be used to implement the subsystem.

In another preferred embodiment, each subsystem data field 70 can include a part configuration data field, including information on how each part in a subsystem is configured in implementing the subsystem. More than one feature data field 68 may include the same subsystem data field 70 and more than one subsystem data field 70 may contain the same part data field 74.

With reference to FIG. 6, in a preferred embodiment of the present invention, each feature is represented in the features database 28 as a feature data record 78. Each feature data record 78 includes at least one implementation data field 80, which includes information on a particular way to implement the feature. Each implementation data field 80 includes at least one subsystem data field 82, which includes information on a subsystem that will be included in implementing the feature. Each feature data field further contains a configuration data field 84, including information on how each subsystem is configured in implementing the feature. Each subsystem data field 82 contains at least one part data field 86, including information on a physical part used to implement the subsystem. In another preferred embodiment, the subsystem data field 82 also contains a parts configuration data field, which includes information on how the parts are configured within a subsystem.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A method of designing an automotive vehicle comprising:
   specifying a set of desired features to include in the vehicle model, wherein each feature defines a discrete portion of the vehicle's functionality, and wherein the features are stored in a database;
   decomposing each feature into a set of functions;
   decomposing each function into a set of parts and configuration information; and
   outputting a first vehicle model representing the vehicle, wherein the first vehicle model includes part and configuration information for implementing the set of desired features.

2. The method of claim 1, further comprising:
   identifying part and configuration conflicts;
   resolving the conflicts; and
   updating the first vehicle model with the results of the conflict resolution.

3. The method of claim 2, further comprising decomposing each feature into a set of alternative implementations, wherein each implementation contains a set of distinct parts and configuration information.

4. The method of claim 3, wherein identifying part and configuration conflicts includes:
   systematically analyzing combinations of function implementations; and
   choosing a set of implementations for each feature such that no implementation of any feature conflicts with an implementation of another feature.

5. The method of claim 1, further comprising optimizing the vehicle model, wherein optimizing includes inputting optimization parameters and using a computer to choose an optimal set of function alternatives.

6. The method of claim 5, wherein the optimization parameters include cost information.

7. The method of claim 1, further comprising:
   creating a second vehicle model;
   specifying at least one feature for the second vehicle model that is included in the first vehicle model:
   decomposing the feature into a set of functions, wherein at least one function is included in the first vehicle model; and
   decomposing each function into a set of parts and configuration information, wherein at least one part is included in the first vehicle model.

8. A system for the feature driven design of an automotive vehicle so as to increase reusability, wherein the vehicle is represented by a vehicle model, the system including:
   a feature database for storing feature records, wherein each feature record includes implementation information for a feature, and wherein a feature represents a piece of vehicle functionality;
   a parts database including information on vehicle parts, wherein a part is a physical vehicle component, and vehicle functionality is implemented by parts; and
   a feature manager coupled to the feature database and the parts database for:
   (a) determining physical implementation information for each feature based on the feature record implementation information; and
   (b) including the physical implementation information in the vehicle model.

9. The system of claim 8, further comprising a conflict manager coupled to the feature manager for identifying conflicts among implementations of a plurality of features in the vehicle model.

10. The system of claim 8, further comprising:
    an input manager for inputting desired vehicle features; and
    an output manager for managing the delivery of vehicle model information to a destination.

11. The system of claim 10, further comprising a browser, wherein the input manager and output manager interface with a user through the use of the browser.

12. The system of claim 10, wherein the output manager manages the communication of vehicle model information to a vehicle release system.

13. The system of claim 12, wherein the output manager translates features centric information into parts centric information for use in the vehicle release system.

14. The system of claim 8, further comprising:
    a model manager for managing a set of vehicle models; and
    a vehicle database for storing a plurality of vehicle models.

15. A model for an automotive vehicle, the model comprising:
    a set of features, wherein each feature includes a discrete set of vehicle functionality;
    a set of functions corresponding to each feature, wherein each function defines a subset of the total feature functionality;
    a set of parts corresponding to each function, wherein the parts can be used to implement the functions; and
    a set of configuration information for each function, wherein the configuration information includes information on the placement and interaction of the parts;
    wherein a vehicle can be implemented using the part and configuration information.

16. The model of claim 15, wherein the model is managed and stored using at least one computer.

* * * * *